(12) United States Patent
Senzaki

(10) Patent No.: US 6,713,846 B1
(45) Date of Patent: Mar. 30, 2004

(54) MULTILAYER HIGH κ DIELECTRIC FILMS

(75) Inventor: Yoshihide Senzaki, Aptos, CA (US)

(73) Assignee: Aviza Technology, Inc., Scotts Valley, CA (US)

( * ) Notice: Subject to any disclaimer, the term of this patent is extended or adjusted under 35 U.S.C. 154(b) by 0 days.

(21) Appl. No.: 10/056,625

(22) Filed: Jan. 25, 2002

Related U.S. Application Data

(60) Provisional application No. 60/264,428, filed on Jan. 26, 2001.

(51) Int. Cl.[7] .............................................. H01L 29/06
(52) U.S. Cl. ................... 257/635; 257/636; 257/637; 257/638; 257/410; 257/411; 257/406; 257/407; 257/380; 257/532; 438/454; 438/458; 438/780; 438/781; 438/785
(58) Field of Search ................... 257/635, 636, 257/637, 638, 532, 410, 411, 406, 407, 380; 438/454, 958, 781, 780, 785

(56) References Cited

U.S. PATENT DOCUMENTS 6,383,873 B1 * 5/2002 Hegde et al. ............... 438/287
6,407,435 B1 * 6/2002 Ma et al. .................... 257/411
6,479,404 B1 * 11/2002 Steigerwald et al. ........ 438/781

OTHER PUBLICATIONS

P.K. Roy et al. "Stacked high-∈ gate dielectric ...technologies", Applied Physics Letters, vol. 72, No.22, Jun. 1, 1998, pp. 2835–2837.*

Manchanda et al., Si–Doped Aluminates for High Temperature Metal–Gate CMOS: Zr–Al–Si–O, A Novel Gate Dielectric for Low Power Applications, 2000 IEEE, pp. 15–18.

Wilk et al., "*Electrical Properties of Hafnium Silicate Gate Dielectrics Deposited Directly on Silicon*", Applied Physics Letter, vol. 74, 1999, pp. 2854–2856.

Wilk et al., "*Stable Zirconium Silicate Gate Dielectrics Deposited Directly on Silicon*", Applied Physics Letters, vol. 76, No. 1, Jan. 3, 2000, pp. 112–114.

D. Wolfe et al., "*Remote Plasma Enhanced–Metal Organic Chemical Vapor Depositioin of Zirconium Oxide / Silicon Oxide Alloy, $(ZrO_2)_x$-$(Si\ O_2)_{1-x}$ ($x \leq 0.5$), Thin Films for Advanced High–K Gate Dielectrics*", Materials Research Society Symposium, vol. 567, 1999, pp. 343–348.

* cited by examiner

*Primary Examiner*—Eddie Lee
*Assistant Examiner*—Junghwa Im
(74) *Attorney, Agent, or Firm*—Dorsey & Whitney LLP

(57) ABSTRACT

A new multilayer dielectric film for improving dielectric constant and thermal stability of gate dielectrics is provided. The multilayer dielectric film comprises a first layer formed of a metal oxide material having a high dielectric constant, and a second layer formed on the first layer. The second layer is formed of a metal silicate material having a dielectric constant lower than the dielectric constant of the first layer. A semiconductor transistor incorporating the multilayer dielectric film is also provided.

13 Claims, 4 Drawing Sheets

MULTILAYER HIGH κ DIELECTRIC FILMS

CROSS REFERENCE TO THE RELATED APPLICATION

This application claims the benefit of U.S. Provisional Application No. 60/264,428 filed Jan. 26, 2001, entitled "Multilayer High Dielectric Constant Oxide Films and Method of Making", the entire disclosure of which is incorporated herein by reference.

FIELD OF THE INVENTION

The present invention relates generally to the field of semiconductors. More specifically, the present invention relates to multilayer high dielectric constant (κ) films and methods of making such films.

BACKGROUND OF THE INVENTION

Design and manufacturing of integrated circuits (ICs) are becoming increasingly complex as the device density of such circuits increases. High density circuits require closely spaced devices and interconnect lines, as well as multiple layers of materials and structures. FIG. 1 schematically shows a conventional metal oxide semiconductor field effect transistor (MOSFET) device that consists of a gate, a gate dielectric such as silicon dioxide ($SiO_2$), and a source/drain channel region. As the size of IC device geometry becomes aggressively smaller, the thickness (t) of the gate dielectric, in the case of $SiO_2$, reaches a physical limitation of approximately 20 Angstroms. Below this thickness, the conventional $SiO_2$ gate dielectric no longer functions as an insulator due to direct tunneling of electrons between the gate and the channel region. Thus, $SiO_2$ gate dielectrics are rapidly becoming one of the limiting factors in device design and manufacturing.

To address this problem, alternative gate dielectric materials have recently been investigated. One approach is to replace the $SiO_2$ gate dielectric with a material that has a higher dielectric constant (κ) than $SiO_2$ (κ of $SiO_2$ is approximately 3.9). It has been found that when a material with a high dielectric constant is used, the physical thickness (t) of the gate dielectric can be increased while maintaining its gate capacitance. Namely, physically thicker high κ gate dielectric can have electrical properties as good as or better than thin $SiO_2$ gate dielectric. A thicker film is easier to manufacture than a thin film and may exhibit better electrical properties.

In the prior art, a number of different high κ materials have been developed. For example, $TiO_2$, $Ta_2O_5$, $Ba_xSr_{l-x}TiO_3$, $ZrO_x$ and $HfO_x$ have been experimented with as gate dielectrics. However, these materials are subject to limitations. $TiO_2$ and $Ta_2O_5$ are thermally unstable and tend to form an undesirable layer of silicon oxide at the interface of the silicon substrate and the gate dielectric. $Ba_xSr_{l-x}TiO_3$ films require high temperature processing which make them undesirable for device integration. While $ZrO_x$ and $HfO_x$ have a higher dielectric constant which is about 25, $ZrO_x$ and $HfO_x$ alone are not suitable as gate dielectrics since undesirable silicon oxide is also formed at the interface between the silicon substrate and the gate dielectric. The formation of additional silicon oxides increases the equivalent oxide thickness (EOT) of the gate dielectric which will result in degradation of device performance.

More recently, zirconium silicate ($ZrSi_xO_y$) and hafnium silicate ($HfSi_xO_y$) have been investigated as new gate dielectric materials. For example, zirconium silicate gate dielectrics have been reported in "Stable zirconiumii silicate gate dielectrics deposited directly on silicon" by G. D. Wilk and R. M. Wallace, Applied Physics Letters, Volume 76, Number 1, Jan. 3, 2000 pp. 112–114 and in "Electrical properties of hafnium silicate gate dielectrics deposited directly on silicon" by G. D. Wilk et al., Applied Physics Letters, Volume 74, 1999 pp. 2854–2856. Zirconium silicate and Hafnium silicate are of particular interest as an alternative gate dielectric material because of its relatively high dielectric constant value. Its dielectric constant is marginally increased to about 10 to 15 depending upon the $ZrO_x/HfO_x$ content in the film. Moreover, zirconium or hafnium silicate exhibits thermal stability in direct contact with the silicon substrate. However, the dielectric constant is not as high as seen with other materials, and such films have not been successfully employed in commercial operation. Accordingly, a significant need exists for the development of high dielectric constant films.

SUMMARY OF THE INVENTION

Accordingly, it is an object of the present invention to provide a high dielectric constant (κ) films for gate dielectrics.

It is further an object of the present invention to provide a semiconductor transistor that incorporates the high κ dielectric film as the gate dielectric.

Another object of the present invention to provide a method of making a high κ dielectric film.

These and other objects are achieved by a new multilayer dielectric film of the present invention employing metal silicates on a silicon substrate and metal oxides having high κ to enhance the performance of semiconductor transistors.

In accordance with the present invention, there is provided a multilayer dielectric film that comprises a first layer formed of a material having a high dielectric constant, and a second layer formed on the first layer. The second layer is formed of a material having a dielectric constant lower than the dielectric constant of the first layer. The first layer is preferably comprised of a metal oxide material having a dielectric constant in the range of 15 to 200, and the second layer is preferably comprised of a metal silicate material having a dielectric constant in the range of 5 to 100.

In one preferred embodiment, the multilayer dielectric film of the present invention comprises a first layer of a metal oxide having the formula of $M_xO_y$, and a second layer of a metal silicate having the formula of $M_xSiO_y$, where M is a metal independently selected from the group consisting of Zr, Hf, Ti, V, Nb, Ta, Cr, Mo, W, Mn, Zn, Al, Ga, In, Ge, Sr, Pb, Sb, Bi, Sc, Y, La, Be, Mg, Ca, Sr, Ba, Th, Lanthanides (Ce, Pr, Nd, Sm, Eu, Gd, Tb, Dy, Ho, Er, Tm, Yb, Lu), and mixtures thereof, x is a number in the range of 1 to 3, and y is a number in the range of 2 to 5. Each of the metal oxide first layer and metal silicate second layer may contain more than one metal elements. The metal in the first and second layers can be same and/or different.

In another preferred embodiment, the multilayer dielectric film of the present invention comprises a first layer of a metal oxide selected from the group consisting of $ZrO_2$ and $HfO_2$, and a second layer of a metal silicate selected from the group consisting of Zr—Si—O and Hf—Si—O.

In another embodiment of the present invention, the multilayer dielectric film of the present invention comprises a first layer having a first and second surfaces, a second layer formed on the first surface of the first layer, and a third layer formed on the second surface of the first layer, wherein the second and third layers are comprised of a material having a dielectric constant lower than the dielectric constant of the first layer.

In another aspect of the present invention, there is provided a method of forming a multilayer dielectric film on a substrate. The method comprises the steps of forming a metal silicate layer on the surface of a substrate, and forming a metal oxide layer atop the metal silicate layer. In one embodiment, the method further comprises forming another metal silicate layer atop the metal oxide layer. The forming step can be carried out by chemical vapor deposition, physical vapor deposition, atomic layer, deposition, aerosol pyrolysis, spray coating or spin-on-coating.

BRIEF DESCRIPTION OF THE FIGURES

The foregoing and other objects of the invention will be more clearly understood from the following description when read in conjunction with the accompanying drawings in which.

DETAILED DESCRIPTION OF THE INVENTION

Figure 1:
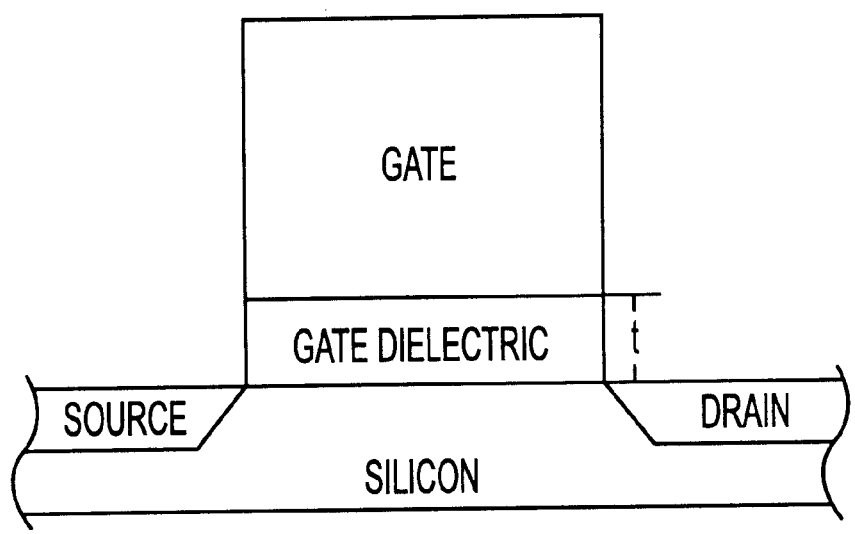
FIG. 1 is a cross-sectional view of a conventional semiconductor transistor.
Figure 2:
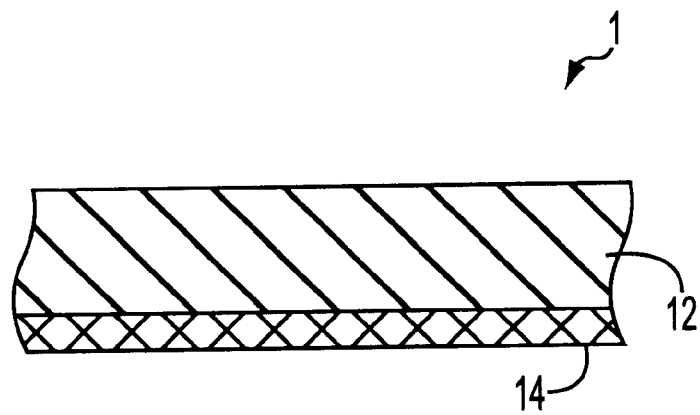
FIG. 2 is a cross sectional view of a multilayer dielectric film in accordance with one embodiment of the present invention.

FIG. 2 schematically shows a cross sectional view of a multilayer dielectric film 1 of the present invention. The multilayer dielectric film 1 comprises a first layer 12 of a material having a high dielectric constant (κ), and a second layer 14 of a material having a lower dielectric constant than that of the first layer 12.

The dielectric constant of the first layer 12 is preferably greater than about 15, more preferably in the range of about 15 to 200, most preferably in the range of about 25–100. The dielectric constant of the second layer 14 is preferably greater than about 5, and more preferably in the range of about 10 to 100.

The first layer 12 of the multilayer dielectric film 5 is comprised of a metal oxide having the formula of $M_xO_y$, where M is a metal selected from the group consisting of Zr, Hf, Ti, V, Nb, Ta, Cr, Mo, W, Mn, Zn, Al, Ga, In, Ge, Sr, Pb, Sb, Bi, Sc, Y, La, Be, Mg, Ca, Sr, Ba, Th, Lanthanides (Ce, Pr, Nd, Sm, Eu, Gd, Tb, Dy, Ho, Er, Tm, Yb, Lu), and mixtures thereof, x is a number in the range of 1 to 3, and y is a number in the range of 2 to 5. The second layer 14 of the multilayer dielectric film 5 is comprised of a metal silicate having the formula of $M_xSiO_y$, where M is a metal selected from the group consisting of Zr, Hf, Ti, V, Nb, Ta, Cr, Mo, W, Mn, Zn, Al, Ga, In, Ge, Sr, Pb, Sb, Bi, Sc, Y, La, Be, Mg, Ca, Sr, Ba, Th, Lanthanides (Ce, Pr, Nd, Sm, Eu, Gd, Tb, Dy, Ho, Er, Tm, Yb, Lu), and mixtures thereof, x is a number in the range of 1 to 3, and y is a number in the range of 2 to 5. Each of the metal oxide first layer 12 and metal silicate second layer 14 may contain more than one metal elements. The metal in the first layer 12 and second layer 14 can be the same or different.

Preferably, the thickness of the first layer 12 of the multilayer dielectric film 5 is formed greater than the thickness of the second layer 14 in order to promote a high dielectric value for the entire dielectric structure. Alternatively, the thickness of the first layer 12 and the second layer 14 can be similar. In one embodiment, the second layer 14 has a thickness of only one or two atomic layers, so that the first layer 12 may be much thicker. In another embodiment where the first layer 12 of the multilayer dielectric film 5 is $ZrO_2$ (the dielectric constant of $ZrO_2$ is 25 which is six times as high as that of $SiO_2$), the thickness of the first layer 12 is about 60 Å. A thickness of 60 Å of $ZrO_2$ first layer behaves approximately same as a thickness of 10 Å of $SiO_2$, first layer (Tox, eq) with regard to electrical properties.

Figure 3:
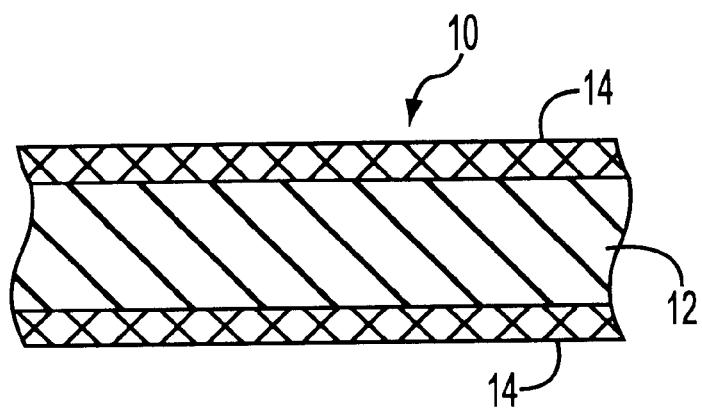
FIG. 3 is a cross-sectional view of a multilayer dielectric film in accordance with another embodiment of the present invention.

FIG. 3 schematically shows a cross sectional view of a multilayer dielectric film 10 of another embodiment of the present invention. The multilayer dielectric film 10 comprises a first layer 12 and two second layers 14 formed on the opposing surfaces of the first layer 12, forming a structure where the first layer 12 is sandwiched between the two second layers 14. The first layer 12 of the multilayer dielectric film 10 is composed of a material having a high dielectric constant, and the two second layers 14 are formed of a material having a lower dielectric constant than that of the first layer 12.

The first layer 12 is comprised of a metal oxide having the formula of $M_xO_y$, where M, x and, y are defined as above. The second layers 14 are comprised of a metal silicate having the formula of $M_xSiO_y$, where M, x, and y are defined as above. The metal in the first metal oxide layer 12 and the second metal silicate layers 14 can be the same or different. Preferably, the metal in the first layer 12 and second layers 14 is comprised of the same metal component for ease of processing.

In one preferred embodiment of the present invention, the first layer 12 of the multilayer dielectric film 10 is formed of a material selected from the group consisting of $ZrO_2$ and $HfO_2$. The second layers 14 are formed of a material selected from the group consisting of Zr—Si—O and Hf—Si—O.

Figure 4:
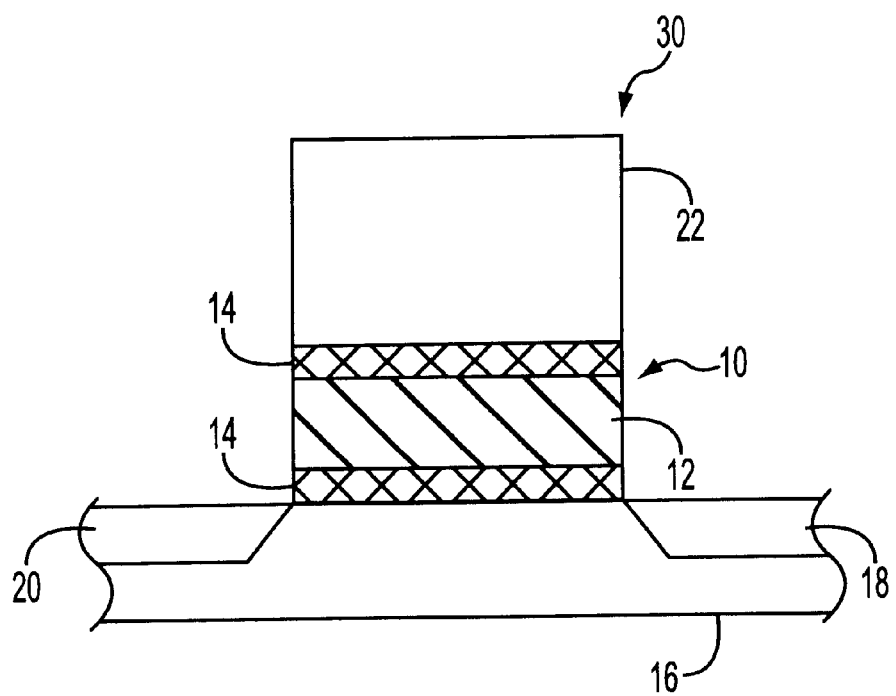
FIG. 4 is a cross-sectional view of a semiconductor transistor with a gate structure incorporating the multilayer dielectric film of the present invention as the gate dielectric.

FIG. 4 schematically shows a cross sectional view of a semiconductor transistor 30 incorporating the multilayer dielectric film in accordance with the present invention. The transistor 30 comprises a silicon substrate 16, a drain region 18 and source region 20 formed in the substrate 16. A multilayer dielectric film 10 is formed atop the substrate 16. A gate 22 is formed atop the multilayer dielectric film 10.

The gate 22 can be comprised of doped polysilicon or conductive materials. The multilayer dielectric film 10 comprises a first layer 12 having a high dielectric constant and at least one second layer 14 having a lower dielectric constant. The at least one second layer 14 is in contact with the surface of silicon substrate 16. The first layer 12 is comprised of a metal oxide having the formula of $M_xO_y$, where M, x and, y are defined as above. The at least one second layer 14 is comprised of a metal silicate having the formula of $M_xSiO_y$, where M, x, and y are defined as above.

In another aspect of the present invention, a method of forming a multilayer dielectric film on a substrate is provided. In one embodiment, the method generally comprises the steps of: forming a metal silicate layer on the surface of a substrate, and forming a metal oxide layer atop the metal silicate layer. In another embodiment, where the first layer 12 of the multilayer dielectric film 10 is sandwiched between two second layers 14 as illustrated in FIG. 4, the method further comprises the step of: forming another metal silicate layer atop the metal oxide layer.

The forming steps may be carried out in a variety of ways. For example the forming step may be carried out by deposition or by coating as know in the art. Suitable deposition methods include, but are not limited to, chemical vapor deposition (CVD), physical vapor deposition (PVD), atomic layer deposition (ALD), and aerosol pyrolysis. PVD further includes sputtering and e-beam evaporation techniques. CVD further includes thermal, plasma, laser, and photo assisted CVD. CVD methods employ an oxygen source. The source of oxygen includes $O_2$, $O_3$, NO, $N_2O$, $H_2O$, alcohol, alkoxides, OH, and Hydrogen Peroxide ($H_2O_2$). Suitable coating methods include spray coating and spin-on-coating techniques from liquid source materials, organic solutions, or aqueous solutions. Any one of the layers can be formed by any one of the above methods and may be carried out by those of ordinary skill in the art.

One advantage of the multilayer dielectric film of the present invention is that it achieves higher dielectric constant values than the metal silicate single layer described in the prior art. The higher dielectric constant values allow thicker gate dielectric components and, therefore, lead to better electrical properties in the MOS device architecture, such as lower leakage current, higher breakdown voltage, more resistant to boron penetration, and the like.

Another advantage of the multilayer dielectric film of the present invention is that it can significantly improve the stability of the high κ dielectric film against changes during further device processing which would degrade the effectiveness of the high κ dielectric film. Commonly during further device processing steps, the structure is exposed to short anneal (10–60 sec.) at temperatures exceeding the temperature used for deposition of the thin dielectric layer. The following reaction may occur during a thermal anneal process which generates undesirable metal silicide and silicon oxide at the interface between the metal oxide and silicon substrate or polysilicon electrode:

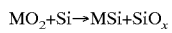

$$MO_2 + Si \rightarrow MSi + SiO_x$$

The formation of additional silicon oxide (κ=3.9) will increase the equivalent oxide thickness (EOT) of the gate dielectric which will result in degradation of device performance. The EOT is a value obtained by capacitance-voltage measurements on simple planar capacitors or extracted from transistor characteristics of full transistors built using the thin dielectric stack as a gate material. The use of the multilayer dielectric film of the present invention, such as a metal silicate/metal oxide/metal silicate stack will resist the device degradation to a higher anneal temperature. If polysilicon is used as the upper gate electrode, a layer of metal silicate is preferably formed at the upper dielectric interface to resist silicon oxide formation at the gate electrode interface.

Figure 5:
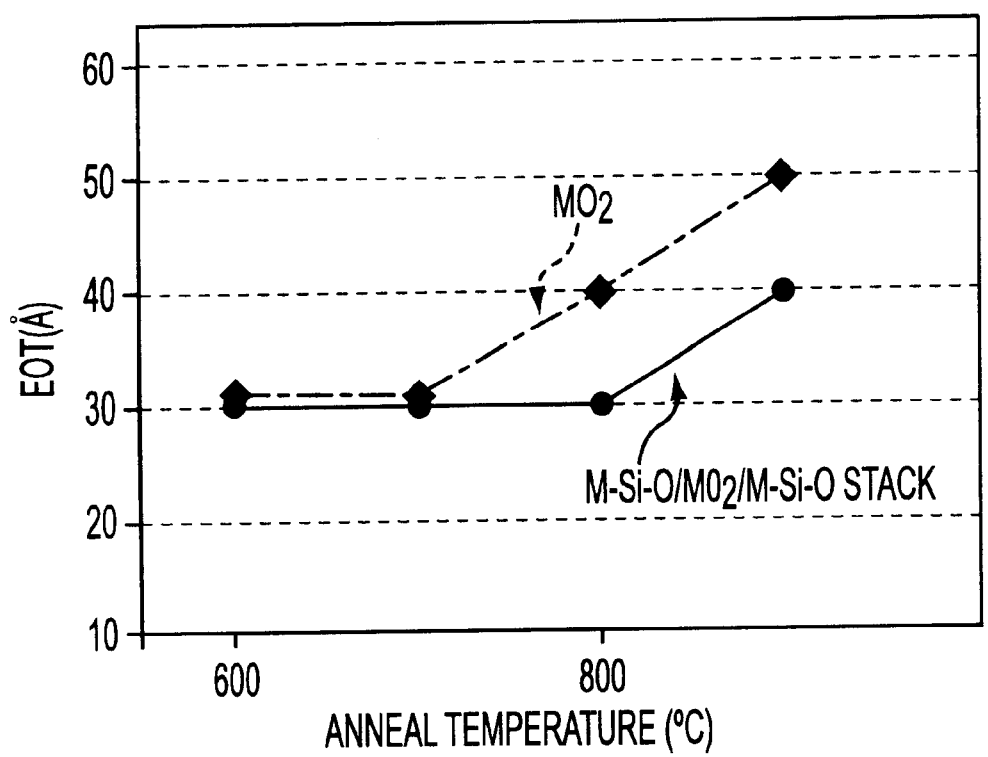
FIG. 5 is a graph illustrating the effect of an anneal process on the equivalent oxide thickness (EOT) on a multilayer dielectric film of the present invention.

FIG. 5 is a graph that illustrates the effect of post deposition thermal anneal treatment on high κ gate dielectric film with an EOT of 30 Å. If a series of samples are annealed under equal times at progressively higher temperature, the onset of the rapid increase of the EOT will occur sooner for the metal oxide in contact with the silicon than for the multilayer structure of the present invention. Where the metal oxide is contained between layers of metal silicate which act as a buffer or interface layer to the silicon, the structure resists degradation to a higher temperature. Alternatively, the test may be carried out using a fixed anneal temperature and subjecting the structure to anneals of varying time. In that case, the multilayer dielectric film of this invention will resist degradation for a longer time than the metal oxide directly in contact with silicon.

While the present invention is disclosed by reference to the preferred embodiments and examples detailed above, it is to be understood that these examples are intended in an illustrative rather than limiting sense, as it is contemplated that modifications and combinations will readily occur to those skilled in the art, which modifications and combinations will be within the scope of the invention and the scope of the appended claims.

What is claimed is:

1. A multilayer dielectric film comprising:
   a first layer having a first and second surfaces, said first layer is comprised of a metal oxide having a dielectric constant κ;
   a second layer formed on the first surface of said first layer; and
   a third layer formed on the second surface of said first layer;
   wherein said second and third layers are comprised of a metal silicate having a dielectric constant lower than the dielectric constant of said first layer.

2. The multilayer dielectric film of claim 1 wherein said first layer is comprised of a material having a dielectric constant in a range of 15 to 200.

3. The multilayer dielectric film of claim 1 wherein said first layer is a metal oxide having the formula of MxOy where M is a metal selected from the group consisting of Zr, Hf, Ti, V, Nb, Ta, Cr, Mo, W, Mn, Zn, Al, Ga, In, Ge, Sr, Pb, Sb, Bi, Sc, Y, La, Be, Mg, Ca, Sr, Ba, Th, Lanthanides (Ce, Pr, Nd, Sm, Eu, Gd, Tb, Dy, Ho, Er, Tm, Yb, Lu), and mixtures thereof, x is a number in the range of 1 to 3, and y is a number in the range of 2 to 5.

4. The multilayer dielectric film of claim 1 wherein said second and third layers are comprised of the same material and have a dielectric constant in a range of 5 to 100.

5. The multilayer dielectric film of claim 4 wherein said second and third layers are a metal silicate having the formula of $M_xSiO_y$, where M is a metal selected from the group consisting of Zr, Hf, Ti, V, Nb, Ta, Cr, Mo, W, Mn, Zn, Al, Ga, In, Ge, Sr, Pb, Sb, Bi, Sc, Y, La, Be, Mg, Ca, Sr, Ba, Th, Lanthanides (Ce, Pr, Nd, Sm, Eu, Gd, Tb, Dy, Ho, Er, Tm, Yb, Lu), and mixtures thereof, x is a number in the range of 1 to 3, and y is a number in the range of 2 to 5.

6. The multilayer dielectric film of claim 1 wherein said first layer is a metal oxide selected from the group consisting of $ZrO_2$ and $HfO_2$ and said second and third layers are a metal silicate selected from the group consisting of Zr—Si—O and Hf—Si—O.

7. A semiconductor transistor, comprising:
   a silicon substrate having a drain and a source region formed therein;
   a multilayer dielectric film formed atop said silicon substrate; and
   a gate formed atop the multilayer dielectric film;
   wherein said multilayer dielectric film comprises
      a first layer having a first and second surfaces, said first layer is comprised of a metal-oxide material having a dielectric constant κ;
      a second layer formed on the first surface of said first layer; and
      a third layer formed on the second surface of said first layer;
      wherein said second and third layers are comprised of a metal silicate material having a dielectric constant lower than the dielectric constant of said first layer.

8. The semiconductor transistor of claim 7 wherein said first layer of said multilayer dielectric film is a metal oxide having the formula of $M_xO_y$, and said second and third layers are a metal silicate having the formula of $M_xSiO_y$, where M is a metal selected from the group consisting of Zr, Hf, Ti, V, Nb, Ta, Cr, Mo, W, Mn, Zn, Al, Ga, In, Ge, Sr, Pb, Sb, Bi, Sc, Y, La, Be, Mg, Ca, Sr, Ba, Th, Lanthanides (Ce, Pr, Nd, Sm, Eu, Gd, Tb, Dy, Ho, Er, Tm, Yb, Lu), and mixtures thereof, x is a number in the range of 1 to 3, and y is a number in the range of 2 to 5.

9. The multi layer dielectric film of claim 1 wherein said metal oxide includes more than one metal element.

10. The multilayer dielectric film of claim 1 wherein said first layer is a metal oxide selected from the group consisting of $ZrO_2$ and $HfO_2$.

11. The multilayer dielectric film of claim 1 wherein said first layer has a thickness in a range of about 30 to 80 Å.

12. The multilayer dielectric film of claim 8 wherein said first layer is a metal oxide selected from the group consisting of $ZrO_2$ and $HfO_2$ and said second and third layers are a metal silicate selected from the group consisting of Zr—Si—O and Hf—Si—O.

13. The multilayer dielectric film of claim 7 wherein said first layer has a thickness in a range of about 30 to 80 Å.

* * * * *